US011444436B2

(12) United States Patent
Hayakawa et al.

(10) Patent No.: US 11,444,436 B2
(45) Date of Patent: Sep. 13, 2022

(54) SEMICONDUCTOR OPTICAL AMPLIFIER, SEMICONDUCTOR OPTICAL AMPLIFICATION DEVICE, OPTICAL OUTPUT DEVICE, AND DISTANCE MEASURING DEVICE

(71) Applicants: FUJIFILM BUSINESS INNOVATION CORP., Tokyo (JP); TOKYO INSTITUTE OF TECHNOLOGY, Tokyo (JP)

(72) Inventors: Junichiro Hayakawa, Ebina (JP); Daiki Tominaga, Ebina (JP); Akemi Murakami, Ebina (JP); Fumio Koyama, Tokyo (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 376 days.

(21) Appl. No.: 16/804,819

(22) Filed: Feb. 28, 2020

(65) Prior Publication Data

US 2020/0280176 A1    Sep. 3, 2020

(30) Foreign Application Priority Data

Mar. 1, 2019   (JP) .............................. JP2019-037512

(51) Int. Cl.
| *H04B 10/00* | (2013.01) |
| *H01S 5/50* | (2006.01) |
| *H04J 14/00* | (2006.01) |
| *H01S 5/125* | (2006.01) |
| *H01S 5/183* | (2006.01) |

(52) U.S. Cl.
CPC ................ *H01S 5/50* (2013.01); *H01S 5/125* (2013.01); *H01S 5/183* (2013.01)

(58) Field of Classification Search
CPC ...... H01S 5/125; H01S 5/183; H01S 5/18308; H01S 5/18311; H01S 5/18313
See application file for complete search history.

(56) References Cited

U.S. PATENT DOCUMENTS

| 2018/0059586 A1* | 3/2018 | Kondo ..................... H01S 5/183 |
| 2019/0386465 A1* | 12/2019 | Hayakawa .......... H01S 5/18391 |
| 2020/0059070 A1* | 2/2020 | Hayakawa .............. H01S 5/026 |

FOREIGN PATENT DOCUMENTS

JP          2018-032793 A       3/2018

* cited by examiner

*Primary Examiner* — Daniel G Dobson
(74) *Attorney, Agent, or Firm* — Oliff PLC (57) ABSTRACT

A semiconductor optical amplifier includes: a substrate; a light source unit that is formed on the substrate; and an optical amplification unit that includes a conductive region extending, from the light source unit, in a predetermined direction along a surface of the substrate, and a nonconductive region around the conductive region. The optical amplification unit amplifies propagation light that propagates, from the light source unit, in the predetermined direction as slow light, and emits the propagation light that is amplified in an emission direction that intersects with the surface. The maximum optical power of the propagation light is larger than the maximum optical power in a vertical oscillation mode.

17 Claims, 5 Drawing Sheets

SEMICONDUCTOR OPTICAL AMPLIFIER, SEMICONDUCTOR OPTICAL AMPLIFICATION DEVICE, OPTICAL OUTPUT DEVICE, AND DISTANCE MEASURING DEVICE

CROSS-REFERENCE TO RELATED APPLICATIONS

This application is based on and claims priority under 35 USC 119 from Japanese Patent Application No. 2019-037512 filed on Mar. 1, 2019.

BACKGROUND

Technical Field

The present invention relates to a semiconductor optical amplifier, a semiconductor optical amplification device, an optical output device, and a distance measuring device.

Related Art

JP-A-2018-032793 discloses, in relation to a semiconductor optical amplification device using a distributed Bragg reflector waveguide, a light emitting element array which includes plural semiconductor laminated structures each of which includes a light emitting unit formed on a substrate, and an optical amplification unit configured to extend along a substrate surface of the substrate from the light emitting unit, and have a length in the extension direction longer than that of the light emitting unit, and amplify light propagating in the extension direction from the light emitting unit, and emit the amplified light from a light emission part formed along the extension direction, wherein the plurality of semiconductor laminated structures is arranged such that the extension directions of the optical amplification units become almost parallel with each other.

SUMMARY

Aspect of non-limiting embodiments of the present disclosure relates to providing a semiconductor optical amplifier, a semiconductor optical amplification device, an optical output device, and a distance measuring device in which output light in a slow light mode increases as compared to the case where a semiconductor optical amplifier using a distributed Bragg reflector waveguide does not have a configuration for suppressing a vertical oscillation mode.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided a semiconductor optical amplifier including: a substrate; a light source unit that is formed on the substrate; and an optical amplification unit that includes a conductive region extending, from the light source unit, in a predetermined direction along a surface of the substrate, and a nonconductive region around the conductive region, the optical amplification unit amplifying propagation light that propagates, from the light source unit, in the predetermined direction as slow light, the optical amplification unit emitting the propagation light that is amplified in an emission direction that intersects with the surface, wherein maximum optical power of the propagation light is larger than maximum optical power in a vertical oscillation mode.

BRIEF DESCRIPTION OF DRAWINGS

Exemplary embodiment(s) of the present invention will be described in detail based on the following figures, wherein.

DETAILED DESCRIPTION

Hereinafter, exemplary embodiments for carrying out the present invention will be described in detail.

First Exemplary Embodiment

Figure 1A:
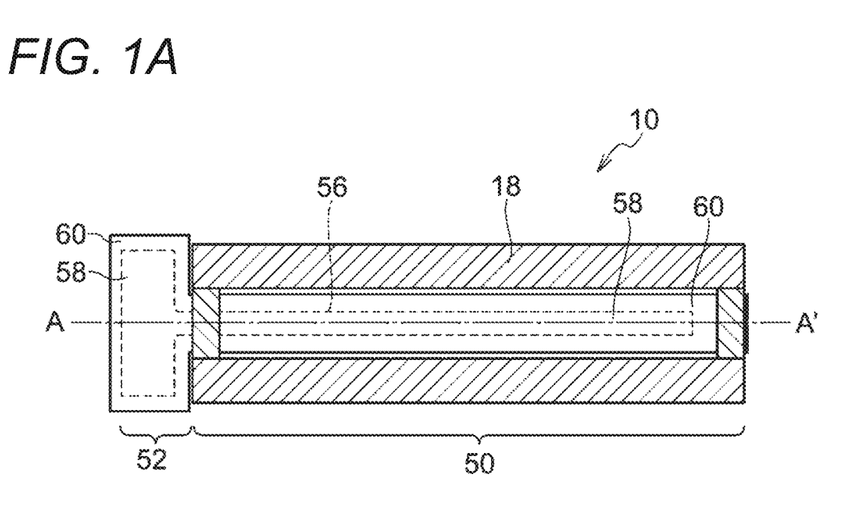
FIG. 1A is a plan view illustrating an example of the configuration of a semiconductor optical amplifier according to a first exemplary embodiment.

With reference to FIG. 1A to FIG. 4, a semiconductor optical amplifier 10 according to a first exemplary embodiment will be described. FIG. 1A is a plan view of the semiconductor optical amplifier 10, and FIG. 1B is a cross-sectional view taken along a line A-A shown in FIG. 1A. As shown in FIG. 1A, the semiconductor optical amplifier (SOA) 10 includes an optical amplification unit 50 and an optical coupler 52.

Figure 1B:
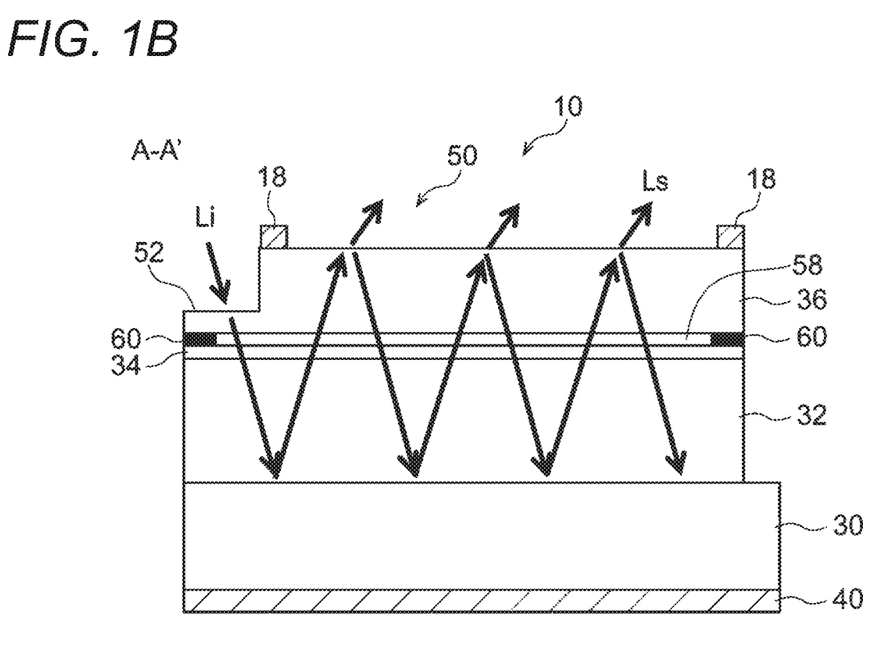
FIG. 1B is a cross-sectional view illustrating the example of the configuration of the semiconductor optical amplifier according to the first exemplary embodiment.

The optical amplification unit 50 has a function of amplifying light (seed light) coupled with the optical coupler 52 and emitting the amplified light. The optical coupler 52 is an example of a "light source unit" according to the present exemplary embodiment. The optical amplification unit 50 according to the present exemplary embodiment is configured, for example, as a surface-emitting type optical amplification unit using a GaAs-based distributed Bragg reflector waveguide (hereinafter, referred to as DBR waveguide). In other words, as shown in FIG. 1B, the optical amplification unit 50 is configured to include an N electrode 40, and a lower DBR 32, an active region 34, an upper DBR 36, a nonconductive region 60, a conductive region 58, and a P electrode 18 formed on a substrate 30.

In the present exemplary embodiment, the substrate 30 is a n-type GaAs substrate, and the N electrode 40 is provided on the rear surface of the substrate 30. Meanwhile, the lower DBR 32 according to the present exemplary embodiment is of n-type, and the upper DBR 36 is of p-type. In order to drive the semiconductor optical amplifier 10, the positive electrode and negative electrode of a power supply for driving are connected to the P electrode 18 and the N electrode 40, respectively, whereby a driving current flows from the P electrode 18 to the N electrode 40. However, the polarities of the substrate 30, the lower DBR 32, and the upper DBR 36 are not limited thereto. The polarities of them may be reversed. In other words, the substrate 30 may be a p-type GaAs substrate, and the lower DBR 32 may be of p-type, and the upper DBR 36 may be of n-type.

The lower DBR 32 pairs up with the upper DBR 36 to be described below and constitutes a resonator which contributes to light emission of the semiconductor optical amplifier 10. The lower DBR 32 is a multi-layer reflector which is configured by alternately and repeatedly stacking two kinds of semiconductor layers each of which has a film thickness of $0.25\lambda/n$ and which are different in their refraction indexes such that the oscillation wavelength of the semiconductor optical amplifier 10 becomes $\lambda$ and the refraction index of the media (semiconductor layers) becomes n. As a specific example, the lower DBR 32 is configured by alternately and repeatedly stacking n-type low-refractive-index layers using $Al_{0.90}Ga_{0.1}As$ and n-type high-refractive-index layers using $Al_{0.2}Ga_{0.8}As$.

The active region 34 according to the present exemplary embodiment may be configured, for example, to include a lower spacer layer, a quantum-well active region, and an upper spacer layer (not shown in the drawings). The quantum-well active region according to the present exemplary embodiment may be composed of, for example, a barrier layer composed of four $Al_{0.3}Ga_{0.7}As$ layers and three GaAs layers provided between them. However, the lower spacer layer and the upper spacer layer are disposed between the quantum-well active region and the lower DBR 32 and between the quantum-well active region and the upper DBR 36, respectively, so as to have a function of adjusting the length of the resonator and a function of serving as a clad layer for confining carriers.

The nonconductive region 60 and the conductive region 58 provided on the active region 34 are p-type oxidation constriction layers, i.e. current constriction layers. In other words, the nonconductive region 60 corresponds to an oxidized region, and the conductive region 58 corresponds to a non-oxidized region. In the present exemplary embodiment, a region of one layer of the multiple layers constituting the upper DBR 36 is oxidized, whereby the nonconductive region 60 (the oxidized region) is formed, and the other region of the corresponding layer except the nonconductive region 60 constitutes the non-oxidized conductive region 58 (the non-oxidized region). Current which flows from the P electrode 18 to the N electrode 40 is constricted by the conductive region 58. In the present exemplary embodiment, the form in which the nonconductive region 60 (the oxidized region) is formed in one layer of the upper DBR 36 is described as an example. However, the nonconductive region is not limited thereto, and may be formed in a plurality of layers of the upper DBR 36, or may be formed in the lower DBR 32.

The upper DBR 36 is a multi-layer reflector which is configured by alternately and repeatedly stacking two kinds of semiconductor layers each of which has a film thickness of $0.25\lambda/n$ and which are different in their refraction indexes. As a specific example, the upper DBR 36 is configured by alternately and repeatedly stacking p-type low-refractive-index layers using $Al_{0.90}Ga_{0.1}As$ and p-type high-refractive-index layers using $Al_{0.2}Ga_{0.8}As$.

The optical coupler 52 according to the present exemplary embodiment is a part which a light source for generating input light (hereinafter, referred to as "seed light Li") for the semiconductor optical amplifier 10 is coupled with. In the present exemplary embodiment, input light is propagated from an external light source (not shown in the drawings) through an optical fiber, and the output end of the optical fiber is coupled with the optical coupler 52 functioning as the light source unit of the semiconductor optical amplifier 10, such that the input light is introduced into the DBR waveguide. As the external light source, for example, a vertical cavity surface emitting laser (VCSEL) is used.

Here, the DBR waveguide according to the present exemplary embodiment will be described in detail. In the semiconductor optical amplifier 10 according to the present exemplary embodiment, the interface between the conductive region 58 and the nonconductive region 60 (hereinafter, referred to as the "oxidation front" 56) extends in the propagation direction of propagation light which is introduced from the optical coupler 52 and propagates through the DBR waveguide (a direction from the left toward the right on the drawing sheet of FIG. 1). Therefore, the seed light Li introduced from the optical coupler 52 propagates in the propagation direction from the left side toward the right side of the drawing sheet. At this time, the propagation light mainly propagates via the lower DBR 32, the active region 34, the conductive region 58, and the upper DBR 36 with a predetermined distribution, as shown in FIG. 1B. Therefore, the "DBR waveguide" is configured to include those parts.

In other words, the semiconductor optical amplifier 10 using the DBR waveguide is composed of one pair of DBRs provided on the semiconductor substrate, the active region provided between the pair of DBRs, and the resonator spacer layers. The region interposed between the DBRs functions as the optical waveguide such that the light input to the DBR waveguide slowly propagates while being multiply reflected in the vertical direction. At this time, if a current (hereinafter, referred to as a driving current) is applied to the active region 34 by the P electrode 18 and the N electrode 40 provided on both sides of the DBRs, the seed light Li is amplified, and the amplified beam is output in a direction intersecting with the substrate surface and inclined forward with respect to the propagation direction of the propagation light in the DBR waveguide (obliquely forward direction) (hereinafter, referred to as "slow light mode light Ls").

In other words, the region of the semiconductor optical amplifier 10 having the P electrode 18 and the N electrode 40 provided thereon (the region interposed between the P electrode 18 and the N electrode 40) has both of the function of serving as the optical waveguide and the function of serving as the optical amplification unit, and emits the amplified light to the direction intersecting with the surface of the substrate 30. In other words, the semiconductor optical amplifier using the DBR waveguide constitutes a surface-emitting type semiconductor optical amplifier. Meanwhile, some parts of the DBRs are removed by etching such that a light incidence part (the optical coupler 52) is formed, and the seed light Li obliquely enters the light incidence part. In this way, the light input to the amplification unit is performed by coupling. At this time, the propagation light propagates through the DBR waveguide while keeping the mode (a vertical mode and a horizontal mode) of the seed light Li, and is output as slow light mode light Ls while keeping the mode of the seed light Li.

Figure 2:
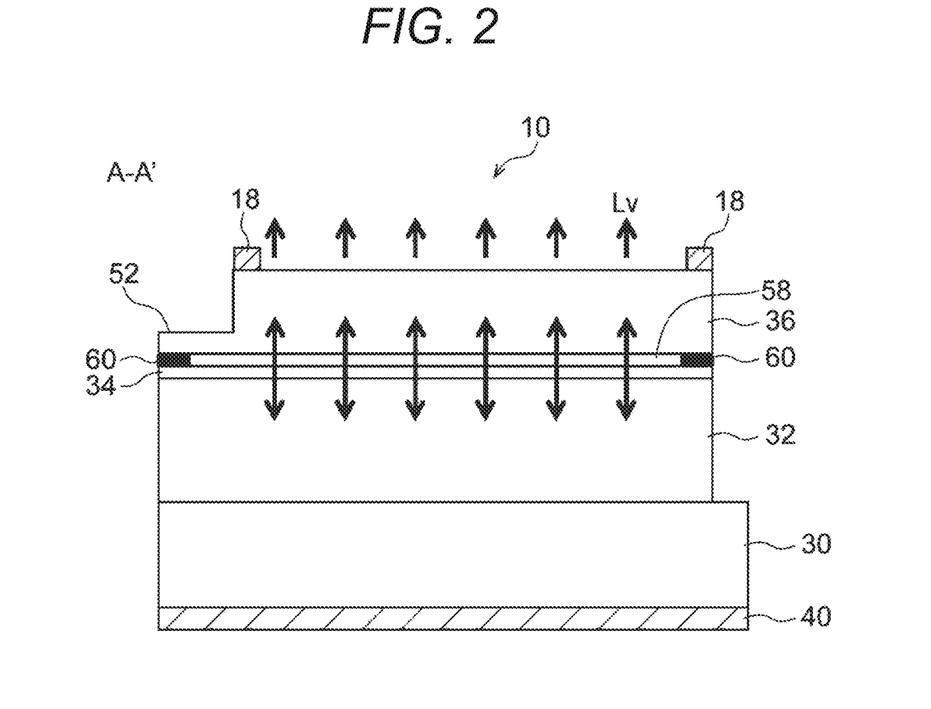
FIG. 2 is a cross-sectional view for explaining a vertical oscillation mode of the semiconductor optical amplifier according to the first exemplary embodiment.

Here, in the semiconductor optical amplifier 10, besides the slow light mode light Ls, light in the vertical oscillation mode (hereinafter, referred to as "vertical oscillation mode light Lv") may be generated. The vertical oscillation mode light Lv is light which is generated by vertical resonance between the lower DBR 32 and the upper DBR 36 as shown in FIG. 2, and is light which is generated by an original so-called oscillation mode of the VCSEL element. As shown in FIG. 2, the vertical oscillation mode light Lv is emitted in a direction perpendicular to the surface of the substrate 30.

Light which the semiconductor optical amplifier 10 is aimed at is the slow light mode light Ls. By the way, the inventors found that if the vertical oscillation mode light Lv is generated, the output power of the slow light mode light Ls decreases according to the intensity of the vertical oscillation mode light Lv. In other words, the inventors found that the vertical oscillation mode light Lv is a factor inhibiting an increase in the power of the slow light mode light Ls. The reason is considered that if the vertical oscillation mode light Lv becomes predominant, the optical power of the slow light mode light Ls decreases by that much. The vertical oscillation mode light Lv oscillates in a mode which is determined according to the structure of the semiconductor optical amplifier 10, i.e. a mode irrelevant to the mode of the seed light Li, and is output. Therefore, in the semiconductor optical amplifier 10 according to the present exemplary embodiment, generation of vertical oscillation mode light Lv is suppressed to the utmost.

First, the basic concept of a means for suppressing generation of vertical oscillation mode light Lv according to the present exemplary embodiment will be described. As described above, if the vertical oscillation mode is suppressed, the slow light mode becomes predominant. For this reason, occurrence of the vertical oscillation mode is made difficult, whereby more output power is distributed to the slow light mode light Ls. Examples of methods of making occurrence of the vertical oscillation mode difficult are as follows:

[First Method: Oscillation Threshold Gain Gth of the Vertical Oscillation Mode is Increased.]

The "oscillation threshold gain Gth" means a minimum gain value required for the vertical oscillation mode to occur in the semiconductor optical amplifier 10. In order to increase the oscillation threshold gain Gth, for example, the reflectance of the upper DBR (hereinafter, referred to as the "reflectance R") is decreased. If the reflectance R is decreased, the amount of optical power to be diverted to vertical resonance decreases, so the oscillation threshold gain Gth increases by that much. In order to decrease the reflectance R, for example, the material composition, film thicknesses, number of pairs, etc. of the upper DBR 36 is changed.

[Second Method: The Wavelength Spectrum of the Gain (Hereinafter, Referred to as the "Wavelength Spectrum GC") to the Short Wavelength Side is Shifted.]

The "wavelength spectrum GC" means the wavelength dependence of the gain of the semiconductor optical amplifier 10. In the present exemplary embodiment, as an example, the center wavelength $\lambda c$ of the wavelength spectrum GC is set to a wavelength shorter than the wavelength $\lambda v$ of the vertical oscillation mode light Lv. Therefore, shifting the wavelength spectrum GC to the short wavelength side is equivalent to increasing the difference between the center wavelength $\lambda c$ of the wavelength spectrum GC and the wavelength $\lambda v$ of the vertical oscillation mode light Lv (hereinafter, referred to as "wavelength offset $\Delta\lambda$"). To this end, for example, the wavelength $\lambda v$ of the vertical oscillation mode light Lv is set by the materials and the film thicknesses in the resonator, and the wavelength spectrum GC is set by the material and film thicknesses of the active region.

[Third Method: Control is Performed with the Driving Current of the Semiconductor Optical Amplifier 10.]

The semiconductor optical amplifier 10 is driven with a driving current equal to or lower than the current at the intersection point of the I-L (current-output power) characteristic of the slow light mode light Ls and the I-L characteristic of the vertical oscillation mode light Lv (hereinafter, referred to as "threshold current IT").

[Fourth Method: The Temperature of the Semiconductor Optical Amplifier 10 by a Temperature Control Circuit is Controlled.]

As specific members for temperature control, for example, temperature control elements such as TECs (Thermoelectric Coolers) represented by Peltier elements are used.

The first method and the second method are methods applicable in the design stage of the semiconductor optical amplifier 10, and the third method and the fourth method are methods applicable in the use stage of a device having the semiconductor optical amplifier 10 and a drive circuit integrated therein (hereinafter, referred to as a "semiconductor optical amplification device"). In the present exemplary embodiment, the first method to the third method are described, and in a second exemplary embodiment to be described below, the fourth method will be described.

Hereinafter, with reference to FIG. 3A to FIG. 4, the first method to the third method will be described in more detail.

First, the first method will be described with reference to FIGS. 3A to 3C. FIGS. 3A to 3C show current-output power characteristics of the slow light mode light Ls (curves denoted by "SLM" in FIGS. 3A to 3C) and current-output power characteristics of the vertical oscillation mode light Lv (curves denoted by "VRM" in FIGS. 3A to 3C) when the reflectance R of the upper DBR 36 is changed. In other words, FIG. 3A shows a characteristic SLM and a characteristic VRM when R is 99.6%, and FIG. 3B shows a characteristic SLM and a characteristic VRM when R is 98.9%, and FIG. 3C shows a characteristic SLM and a characteristic VRM when R is 98.4%. In all of FIGS. 3A, 3B, and 3C, the reflectance of the lower DBR 32 is set to be almost 100%. Further, the output light of the slow light mode light Ls and the output light of the vertical oscillation mode light Lv are separated by the difference between optical systems based on the difference between emission angles. Alternatively, since their wavelengths are different, they may be separated by an optical filter.

Figure 3A:
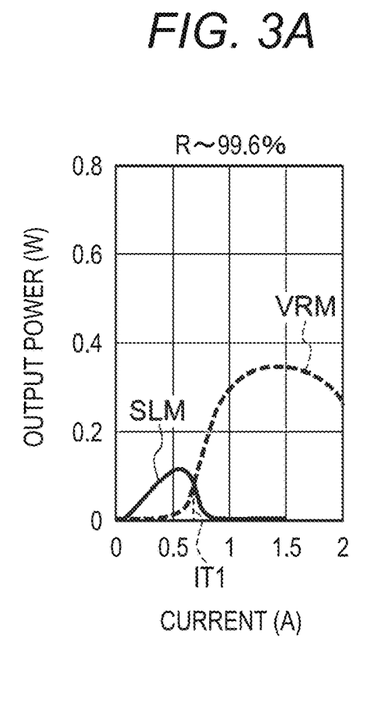
FIGS. 3A to 3C are graphs illustrating differences between current-output power characteristics in a slow light mode and current-output power characteristics in a vertical oscillation mode which are caused by differences between the reflections of upper DBRs of semiconductor elements according to exemplary embodiments.
Figure 3B:
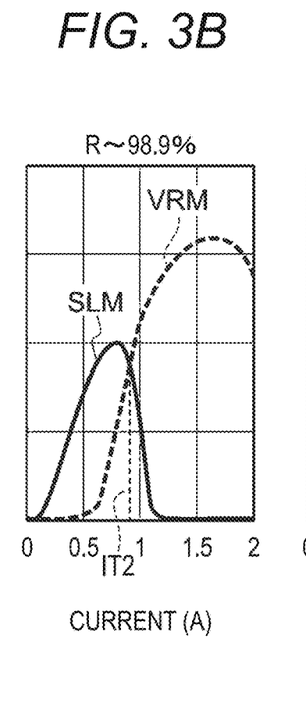
Figure 3C:
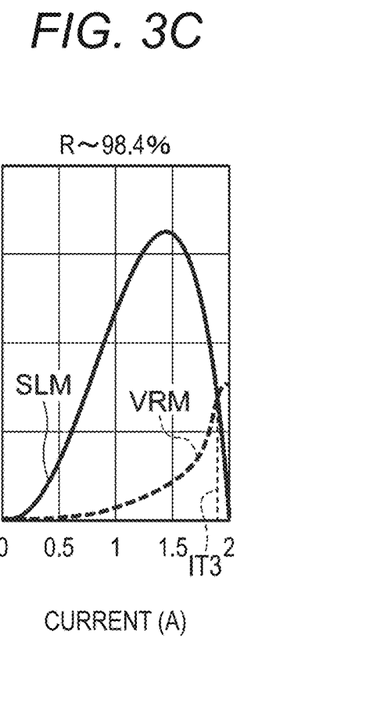
Figure 4:
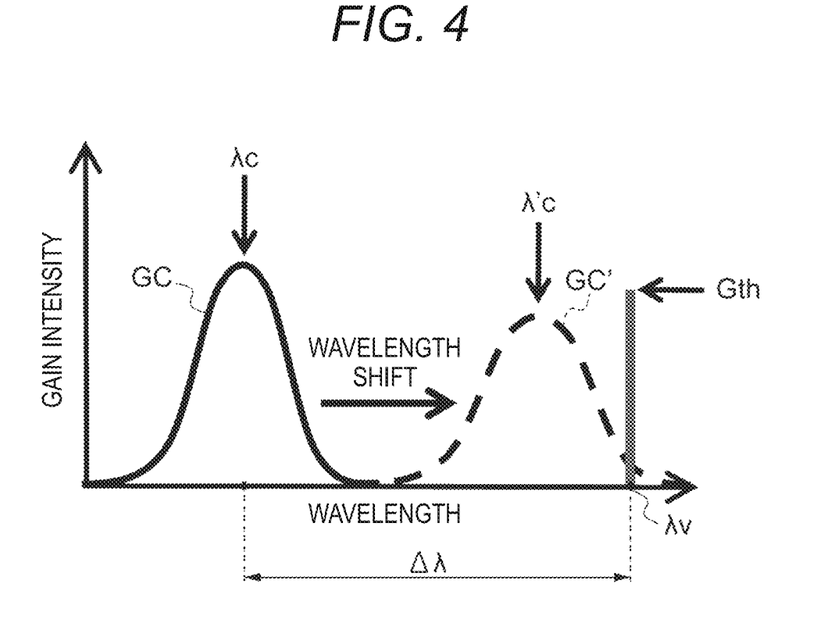
FIG. 4 is a view for explaining the relation between the vertical oscillation mode and the wavelength spectrum of gain.

As shown in FIGS. 3A to 3C, as the reflectance R of the upper DBR 36 is decreased, the slow light mode gets predominant over the vertical oscillation mode. In other words, in FIG. 3A, the characteristic VRM is overwhelmingly predominant over the characteristic SLM; whereas in FIG. 3C, the characteristic SLM is predominant. Therefore, it is possible to suppress the vertical oscillation mode light Lv and increase the slow light mode light Ls by decreasing the reflectance R of the upper DBR 36. Further, if the reflectance R of the upper DBR 36 is decreased, the wavelength spectrum GC shifts to the short wavelength side. This is attributable to a band filing effect. This increases the wavelength offset Δλ. Therefore, even from this point, it is preferable to decrease the reflectance R of the upper DBR 36 from the viewpoint of increasing the slow light mode light Ls. However, if the reflectance R of the upper DBR 36 is excessively decreased, the emission angle of the emission light of the slow light mode light Ls with respect to the surface of the substrate 30 decreases (the slow light mode light becomes parallel with the substrate surface), so it becomes difficult to use the emission light. Therefore, there is a limit to reducing the reflectance R of the upper DBR 36. For this reason, a lower limit value may be set for the reflectance R. The lower limit value for the reflectance R may be set, for example, by checking the relation between the amount of increase in the output power of the slow light mode light Ls and the emission angle thereof by experiments, simulations, etc., in advance.

As shown in FIG. 3C, if the peak value (maximum optical power) of the slow light mode light Ls is set to be higher than the peak value (maximum optical power) of the vertical oscillation mode light Lv as an example of characteristics of the semiconductor optical amplifier 10, the semiconductor optical amplifier 10 which the present exemplary embodiment is aimed at is obtained. Further, for example, if the reflectance R of the upper DBR 36 is set to about 98%, the characteristic as shown in FIG. 3C is achieved.

Now, the third method will be described with reference to FIGS. 3A to 3C. In FIG. 3A to FIG. 3C, threshold currents IT1, IT2, and IT3 obtained from the intersections of the characteristics SLM and the characteristics VRM are shown. From the definition of the threshold current IT, in all of FIG. 3A to FIG. 3C, if the driving current of the semiconductor optical amplifier 10 is set to be equal to or lower than the threshold current IT, the slow light mode light Ls becomes predominant. Therefore, for example, even if the characteristic of the semiconductor optical amplifier 10 is given (even if the characteristic of the semiconductor optical amplifier 10 is any one of FIGS. 3A to 3C), it is possible to suppress the vertical oscillation mode light Lv and increase the slow light mode light Ls by the driving current.

Now, the above-mentioned second method will be described with reference to FIG. 4. FIG. 4 is a view illustrating the gain intensity of the wavelength spectrum GC of the semiconductor optical amplifier 10 and the wavelength dependence of the gain intensity of the vertical oscillation mode light Lv. As described above, in the present exemplary embodiment, the center wavelength λc of the wavelength spectrum GC is set on the short wavelength side from the wavelength λv of the vertical oscillation mode light Lv. As described above, in the vertical oscillation mode light Lv, the oscillation threshold gain Gth which is determined by the design of the semiconductor optical amplifier 10 exists. Further, for example, if the wavelength spectrum GC having the center wavelength λc shifts to the long wavelength side, thereby becoming a wavelength spectrum GC' having a center wavelength λc', and the wavelength spectrum GC exceeds the oscillation threshold gain Gth, the semiconductor optical amplifier 10 oscillates in the vertical oscillation mode. In other words, if the wavelength spectrum GC is set to be equal to or lower than the oscillation threshold gain Gth, the slow light mode light Ls becomes predominant.

As described above, if the reflectance R of the upper DBR 36 is decreased, the oscillation threshold gain Gth increases, and the wavelength spectrum GC shifts to the short wavelength side, in other words, the wavelength offset Δλ increases. Therefore, if the reflectance R is decreased, the slow light mode light Ls increases. For example, if the wavelength difference between the center wavelength λc of the wavelength spectrum GC of the gain which the active region has and the wavelength λv of the vertical oscillation mode light Lv (i.e. the wavelength offset Δλ) is set such that the maximum optical power of the slow light mode light Ls becomes larger than the maximum optical power of the vertical oscillation mode light Lv, the semiconductor optical amplifier 10 according to the present exemplary embodiment is implemented.

Meanwhile, it is known that if the temperature of the semiconductor optical amplifier 10 rises (for example, in the case where switching from the state where the power supply is not connected to the semiconductor optical amplifier 10 to the state where the power supply is connected thereto is performed), the wavelength spectrum GC shifts to the long wavelength side. Therefore, if the temperature of the semiconductor optical amplifier 10 rises, it becomes easy for the vertical oscillation mode light Lv to be generated, and the slow light mode light Ls decreases by that much. Further, it is known that the temperature coefficient of the wavelength of the slow light mode light Ls is an order of magnitude greater than the temperature coefficient of the wavelength of the vertical oscillation mode light Lv. Therefore, if the driving current is increased, the temperature rises, and the wavelength offset Δλ decreases, and it becomes easy for the semiconductor optical amplifier to oscillate in the vertical oscillation mode. For this reason, for example, in the case of using the semiconductor optical amplifier in a wide temperature range, temperature control becomes important. In other words, whether temperature control is necessary or not depends on the temperature range in which the semiconductor optical amplification device is used.

As described above in detail, in the semiconductor optical amplifier 10 according to the present exemplary embodiment, the seed light Li introduced from the outside is amplified and emitted while its characteristic is kept. Therefore, if light in a single mode is introduced as the seed light Li, light output of the semiconductor optical amplifier 10 may be performed in the single mode. Therefore, the beam quality improves, and the collimating property improves. Also, since polarization of the seed light Li is kept, control on the polarization direction is easy. Further, since the power density is much higher as compared to those of VCSEL elements, the semiconductor optical amplifier 10 is particularly suitable for high optical power.

Second Exemplary Embodiment

Figure 5:
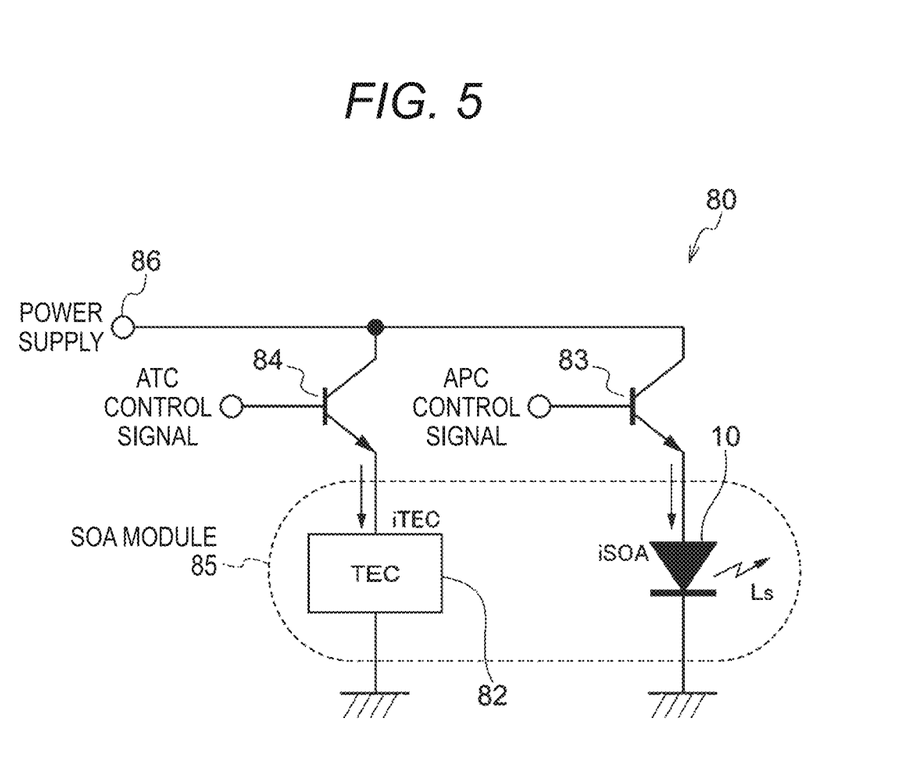
FIG. 5 is a circuit diagram illustrating a semiconductor optical amplification device according to a second exemplary embodiment.

With reference to FIG. 5, a semiconductor optical amplification device 80 according to a second exemplary embodiment which is related to the third method and the fourth method will be described. FIG. 5 is a circuit diagram of the semiconductor optical amplification device 80 configured by adding a drive circuit for the semiconductor optical amplifier 10 and a temperature control circuit to the semiconductor optical amplifier 10. In the present exemplary embodiment, the semiconductor optical amplification device 80 including both of the drive circuit and the temperature control circuit will be described as an example; however, according to the temperature range in which the semiconductor optical amplifier 10 is used, etc., the temperature control circuit may be omitted.

As shown in FIG. 5, the semiconductor optical amplification device 80 is configured to include an SOA module 85, and the drive circuit and the temperature control circuit for the semiconductor optical amplifier 10 (not shown in the drawings). The SOA module 85 includes the semiconductor optical amplifier 10 and a TEC 82 using, for example, a Peltier element or the like. The SOA module 85 further includes an output monitoring element (not shown in the drawings) for monitoring the output power of the semiconductor optical amplifier 10, and a temperature monitoring element (not shown in the drawings) for monitoring the temperature of the SOA module 85. A transistor 83 to which an APC (Automatic Power Control) control signal is input is a transistor provided at the output stage of the drive circuit, and a transistor 84 to which an ATC (Automatic Temperature Control) control signal is input is a transistor provided at the output stage of the temperature control circuit.

To the semiconductor optical amplifier 10, a driving current iSOA is supplied from the transistor 83 connected to a power supply 86, and the semiconductor optical amplifier mainly emits the slow light mode light Ls. The driving current iSOA is APC-controlled on the basis of the output power detected by the output monitoring element, such that the output power of the slow light mode light Ls is kept constant. To the TEC 82, a temperature control current iTEC is supplied from the transistor 84 connected to the power supply 86, such that the temperature of the SOA module 85 is kept constant. The temperature control current iTEC is ATC-controlled on the basis of the temperature detected by the temperature monitoring element. By the above-described operation, the above-mentioned fourth method is implemented. The current-output power characteristic of the semiconductor optical amplifier 10 in the above-mentioned case is not particularly limited, and may be, for example, any one characteristic of FIG. 3A to FIG. 3C.

Meanwhile, instead of the APC control, or in addition to the APC control, a configuration for controlling the driving current iSOA to be equal to or lower than the threshold current IT may be employed to implement the above-mentioned third method. The current-output power characteristic of the semiconductor optical amplifier 10 in the above-mentioned case is not particularly limited, and may be, for example, any one characteristic of FIG. 3A to FIG. 3C. In the present exemplary embodiment, the SOA module 85 having the semiconductor optical amplifier 10 and the TEC 82 integrated therein has been described as an example; however, the SOA module is not limited thereto, and may have a form having the semiconductor optical amplifier 10 and the TEC 82 discretely mounted.

Third Exemplary Embodiment

Figure 6A:
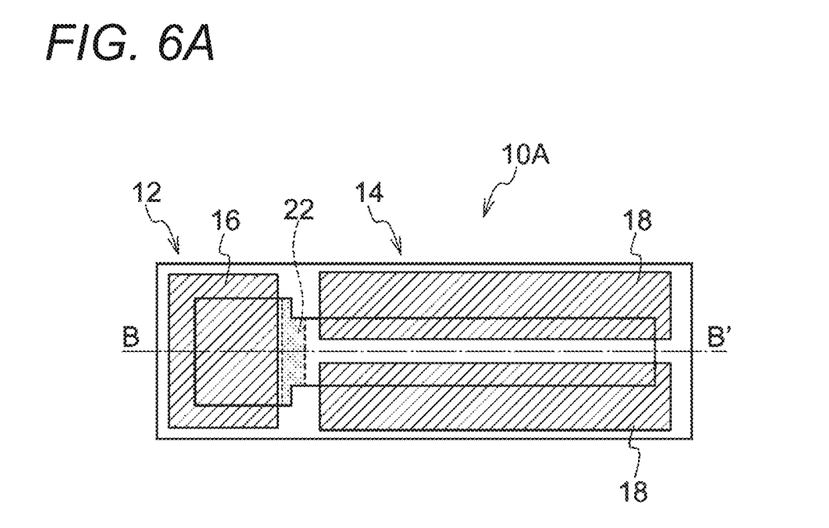
FIG. 6A is a plan view illustrating an example of a semiconductor optical amplifier according to a third exemplary embodiment.
Figure 6B:
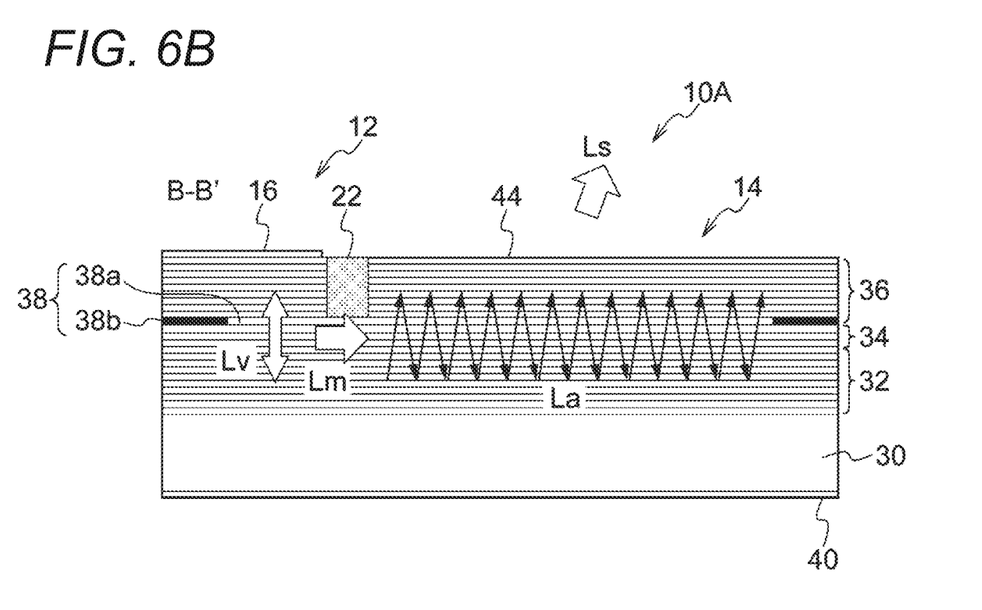
FIG. 6B is a cross-sectional view illustrating the example of the semiconductor optical amplifier according to the third exemplary embodiment.

With reference to FIGS. 6A and 6B, a semiconductor optical amplifier 10A according to a third exemplary embodiment will be described. FIG. 6A shows a plan view of the semiconductor optical amplifier 10A, and FIG. 6B shows a cross-sectional view taken along a line B-B of FIG. 6A. The semiconductor optical amplifier 10 according to the above-described exemplary embodiments has the form in which the seed light Li is supplied from the outside. However, the semiconductor optical amplifier 10A has a form having a light source unit for generating seed light Li and a semiconductor optical amplifier integrated therein.

As shown in FIG. 6A, the semiconductor optical amplifier 10A is configured to include an optical amplification unit 14 and a light emitting unit 12. In the optical amplification unit 14, a pair of P electrodes 18 which are anode-side electrodes of the optical amplification unit 14 are disposed, and in the light emitting unit 12, a P electrode 16 which is an anode electrode of the light emitting unit 12 is disposed. The slow light mode light Ls is emitted from between the pair of P electrodes 18. Also, between the optical amplification unit 14 and the light emitting unit 12, a current blocking region 22 for electrically isolating them is formed.

As shown in FIG. 6B, the semiconductor optical amplifier 10A includes a lower DBR 32 formed on a substrate 30, an active region 34 formed on the lower DBR 32, and an upper DBR 36 formed on the active region 34, and mainly emits slow light mode light Ls from a light emitting surface 44. Also, on the rear surface of the substrate 30, an N electrode 40 is formed.

The light emitting unit 12 further includes an oxidation constriction layer 38, and the oxidation constriction layer 38 includes a non-oxidized region 38a and an oxidized region 38b. The light emitting unit 12 has the configuration of a VCSEL element, and an applied current is constricted in the non-oxidized region 38a. The light emitting unit 12 is configured to include the lower DBR 32 and the upper DBR 36 which are a pair of distributed Bragg reflectors provided on the substrate 30, and the active region 34 (including, for example, an active layer, a lower spacer layer, and an upper spacer layer) provided between the pair of distributed Bragg reflectors, similarly to a general VCSEL. Further, a current is applied to the active layer by the P electrode 16 and the N electrode 40 which are electrodes provided on both sides of the distributed Bragg reflectors, whereby oscillation is caused in a direction perpendicular to the surface of the substrate 30.

Even in the semiconductor optical amplifier 10A according to the present exemplary embodiment, the driving current flows between the P electrode 16 and the N electrode 40, whereby vertical oscillation mode light Lv is generated between the lower DBR 32 and the upper DBR 36. Since the upper surface of the light emitting unit 12 is covered with the P electrode 16, the vertical oscillation mode light Lv is reflected from the electrode 16, and stays inside the light emitting unit 12. In other words, the electrode 16 according to the present exemplary embodiment also serves as a light blocking part for blocking light such that the vertical oscillation mode light Lv in the light emitting unit 12 is not emitted to the outside.

As shown in FIG. 6B, a part of the vertical oscillation mode light Lv leaks in a direction along the substrate surface of the substrate 30 (a direction parallel with the substrate 30, in other words, a direction perpendicular to the stacking direction of the layers of the semiconductor optical amplifier 10A), thereby becoming leakage light Lm which seeps out toward the optical amplification unit 14. The leakage light Lm advances in a direction intersecting with the oscillation direction, and becomes so-called slow light state. The leakage light Lm propagates in the longitudinal direction (extension direction) of the semiconductor optical amplifier 10A through the optical amplification unit 14 while being repeatedly reflected between the lower DBR 32 and the upper DBR 36 provided in the optical amplification unit 14. The propagating light is amplified, thereby becoming amplified light La, and the amplified light La is emitted as slow light mode light Ls from the light emitting surface 44.

As described above, according to the semiconductor optical amplifier 10A of the present exemplary embodiment, since the semiconductor optical amplifier and the light emitting unit for generating seed light Li are integrated, a loss in coupling between the seed light Li and the optical amplification unit is less, and mounting is easier.

Fourth Exemplary Embodiment

Figure 7A:
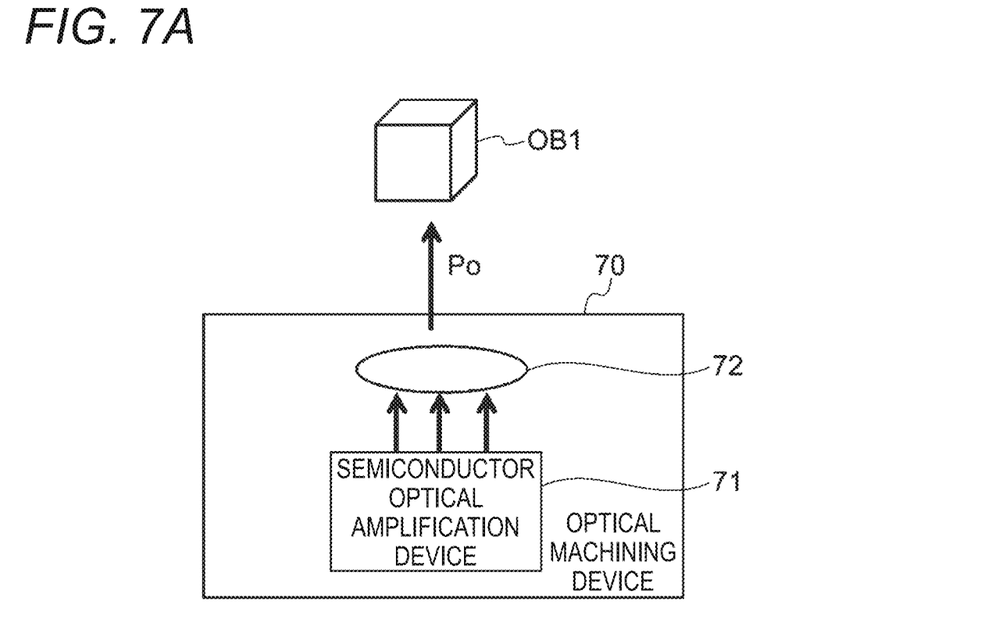
FIG. 7A is a block diagram illustrating an example of an optical machining device according to a fourth exemplary embodiment.

Now, an optical output device and a distance measuring device according to a fourth exemplary embodiment will be described with reference to FIGS. 7A and 7B. FIG. 7A shows a block diagram of an optical machining device 70 which is an example of an optical output device according to the present invention, and FIG. 7B shows a block diagram of a distance measuring device 90.

As shown in FIG. 7A, the optical machining device 70 includes a semiconductor optical amplification device 71 and a condensing lens 72. The semiconductor optical amplification device 71 is, for example, the semiconductor optical amplification device 80 according to the above-described exemplary embodiments. As shown in FIG. 7A, light emitted from the semiconductor optical amplification device 71 is condensed by the lens 72, and is radiated as output light Po onto an object OB1 to be machined, whereby machining on the object OB1 is performed. As described above, the output light Po from the semiconductor optical amplification device 71 has high power density, and polarization thereof is controlled. Therefore, according to the optical machining device 70, satisfactory machining characteristics are achieved.

Figure 7B:
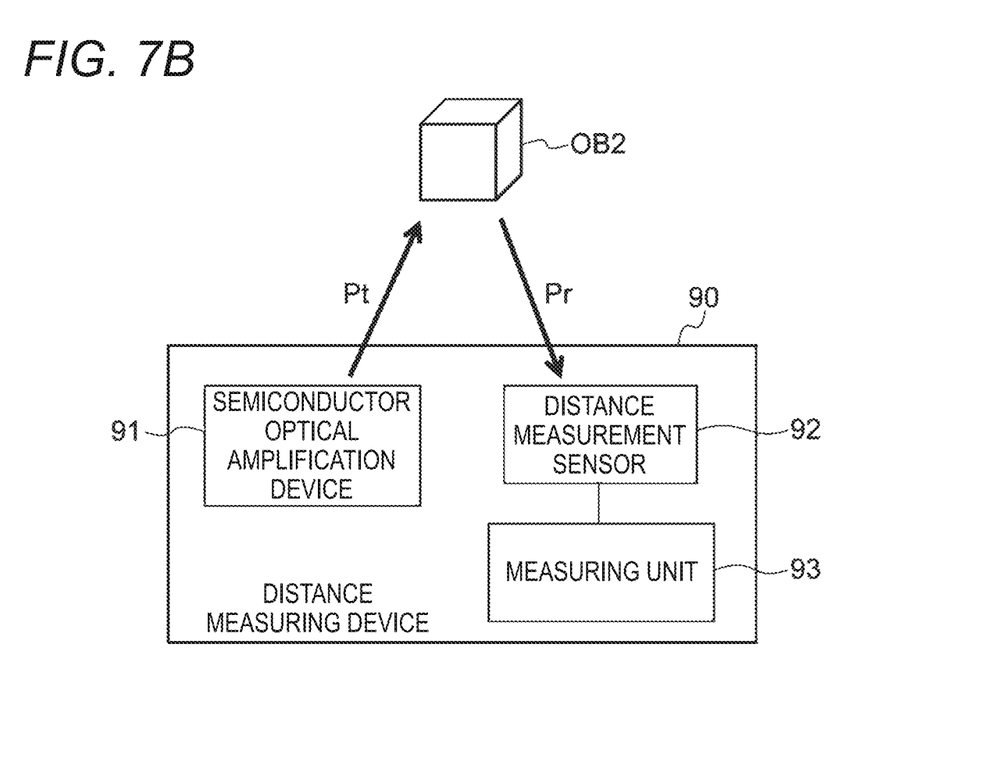
FIG. 7B is a block diagram illustrating an example of a distance measuring device according to the fourth exemplary embodiment.

Meanwhile, as shown in FIG. 7B, the distance measuring device 90 includes a semiconductor optical amplification device 91, a distance measurement sensor 92, and a measuring unit 93. The semiconductor optical amplification device 91 is, for example, the semiconductor optical amplification device 80 according to the above-described exemplary embodiments. Also, the distance measurement sensor 92 is configured with, for example, a light receiving element such as a photodiode, and the measuring unit 93 is configured mainly with semiconductor devices such as a CPU, an ASIC, etc.

In the distance measuring device 90, projection light Pt emitted from the semiconductor optical amplification device 91 is radiated onto an object OB2 to be measured (for example, a person or an object), and the reflected light from the object OB2 is input as received light Pr to the distance measurement sensor 92. The received light Pr input to the distance measurement sensor 92 is converted into an electric signal, and on the basis of the electric signal, predetermined arithmetic processing is performed in the measuring unit 93, whereby the distance between the object OB2 and, for example, the distance measuring device 90 is measured.

In each exemplary embodiment described above, the methods of increasing slow light mode light Ls have been individually described. However, naturally, at least two of them may be combined to increase slow light mode light Ls. For example, the second method and the fourth method may be combined to set the wavelength offset Δλ to a certain value and use temperature control together such that shift of the wavelength spectrum GC to the long wavelength side is suppressed.

Also, in each exemplary embodiment described above, the form for suppressing generation of vertical oscillation mode light Lv has been described as an example. However, the semiconductor optical amplifier may be configured from the outset such that the vertical oscillation mode does not occur at all. In order to prevent the vertical oscillation mode from occurring, for example, in the design of the semiconductor optical amplifier, the number of pairs of DBRs may be decreased and the reflectance may be decreased, thereby increasing the oscillation threshold gain Gth and setting the gain intensity to lower than the oscillation threshold gain Gth.

The foregoing description of the embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A semiconductor optical amplifier comprising:
   a substrate;
   a light source unit that is formed on the substrate; and
   an optical amplification unit that includes a conductive region extending, from the light source unit, in a predetermined direction along a surface of the substrate, and a nonconductive region around the conductive region, the optical amplification unit amplifying propagation light that propagates, from the light source unit, in the predetermined direction as slow light, the optical amplification unit emitting the propagation light that is amplified in an emission direction that intersects with the surface,
   wherein maximum optical power of the propagation light is larger than maximum optical power in a vertical oscillation mode.

2. A semiconductor optical amplification device comprising:
   the semiconductor optical amplifier according to claim 1; and
   a drive unit that drives the semiconductor optical amplifier with driving current such that optical power in a slow light mode becomes larger than optical power in a vertical oscillation mode.

3. An optical output device comprising:
   the semiconductor optical amplification device according to claim 2; and
   a light condensing unit that condenses light emitted from the semiconductor optical amplification device.

4. A distance measuring device comprising:
   the semiconductor optical amplification device according to claim 2;
   a light receiving unit that receives light that is emitted from the semiconductor optical amplification device and is reflected from an object to be measured; and
   a measuring unit that measures the distance to the object based on the light received by the light receiving unit.

5. The semiconductor optical amplification device according to claim 2, further comprising
   a temperature control unit that controls temperature of the semiconductor optical amplifier such that the optical power in the slow light mode becomes larger than the optical power in the vertical oscillation mode while the semiconductor optical amplifier being driven.

6. An optical output device comprising:
   the semiconductor optical amplification device according to claim 5; and
   a light condensing unit that condenses light emitted from the semiconductor optical amplification device.

7. A distance measuring device comprising:
   the semiconductor optical amplification device according to claim 5;
   a light receiving unit that receives light that is emitted from the semiconductor optical amplification device and is reflected from an object to be measured; and
   a measuring unit that measures the distance to the object based on the light received by the light receiving unit.

8. The semiconductor optical amplification device according to claim 5, wherein
the temperature control unit controls temperature of the optical amplification unit to prevent oscillation in the vertical oscillation mode.

9. An optical output device comprising:
the semiconductor optical amplification device according to claim 8; and
a light condensing unit that condenses light emitted from the semiconductor optical amplification device.

10. A distance measuring device comprising:
the semiconductor optical amplification device according to claim 8;
a light receiving unit that receives light that is emitted from the semiconductor optical amplification device and is reflected from an object to be measured; and
a measuring unit that measures the distance to the object based on the light received by the light receiving unit.

11. The semiconductor optical amplifier according to claim 1, wherein
oscillation in a vertical oscillation mode is prevented.

12. A semiconductor optical amplification device comprising:
a substrate;
a light source unit that is formed on the substrate;
an optical amplification unit that includes a conductive region extending, from the light source unit, in a predetermined direction along a surface of the substrate, and a nonconductive region around the conductive region, the optical amplification unit amplifying propagation light that propagates, from the light source unit, in the predetermined direction as slow light, the optical amplification unit emitting the propagation light that is amplified in an emission direction that intersects with the surface; and
a drive unit that drives the optical amplification unit with driving current such that optical power in a slow light mode becomes larger than optical power in a vertical oscillation mode.

13. An optical output device comprising:
the semiconductor optical amplification device according to claim 12; and
a light condensing unit that condenses light emitted from the semiconductor optical amplification device.

14. A distance measuring device comprising:
the semiconductor optical amplification device according to claim 12;
a light receiving unit that receives light that is emitted from the semiconductor optical amplification device and is reflected from an object to be measured; and
a measuring unit that measures the distance to the object based on the light received by the light receiving unit.

15. A semiconductor optical amplification device comprising:
a light source unit that is formed on a substrate;
an optical amplification unit that includes a conductive region extending, from the light source unit, in a predetermined direction along a surface of the substrate, and a nonconductive region around the conductive region, the optical amplification unit amplifying propagation light that propagates, from the light source unit, in the predetermined direction as slow light, and emitting the propagation light that is amplified in an emission direction that intersects with the surface; and
a temperature control unit that controls temperature of the optical amplification unit such that optical power in a slow light mode becomes larger than optical power in a vertical oscillation mode while the optical amplification unit being driven.

16. An optical output device comprising:
the semiconductor optical amplification device according to claim 15; and
a light condensing unit that condenses light emitted from the semiconductor optical amplification device.

17. A distance measuring device comprising:
the semiconductor optical amplification device according to claim 15;
a light receiving unit that receives light that is emitted from the semiconductor optical amplification device and is reflected from an object to be measured; and
a measuring unit that measures the distance to the object based on the light received by the light receiving unit.

* * * * *

UNITED STATES PATENT AND TRADEMARK OFFICE
CERTIFICATE OF CORRECTION

PATENT NO. : 11,444,436 B2
APPLICATION NO. : 16/804819
DATED : September 13, 2022
INVENTOR(S) : Junichiro Hayakawa et al.

It is certified that error appears in the above-identified patent and that said Letters Patent is hereby corrected as shown below:

On the Title Page

Item (73) should read:
Assignee: FUJIFILM Business Innovation Corp., Tokyo (JP)
TOKYO INSTITUTE OF TECHNOLOGY, Tokyo (JP)

Signed and Sealed this
Sixteenth Day of May, 2023

Katherine Kelly Vidal
*Director of the United States Patent and Trademark Office*